United States Patent
Sasaki et al.

(10) Patent No.: US 6,191,577 B1
(45) Date of Patent: Feb. 20, 2001

(54) MAGNETIC SENSOR EXHIBITING LARGE CHANGE IN RESISTANCE AT LOW EXTERNAL MAGNETIC FIELD

(75) Inventors: Yoshito Sasaki; Naoya Hasegawa; Akihiro Makino, all of Niigata-ken; Ichiro Tokunaga; Seiji Kikuchi, both of Miyagi-ken, all of (JP)

(73) Assignee: Alps Electric Co., Ltd., Tokyo (JP)

(*) Notice: Under 35 U.S.C. 154(b), the term of this patent shall be extended for 0 days.

(21) Appl. No.: 09/036,606

(22) Filed: Mar. 6, 1998

(30) Foreign Application Priority Data

Mar. 7, 1997 (JP) .................................................. 9-053717

(51) Int. Cl.$^7$ .............................. G01R 33/09; G01B 7/30; H01L 43/08
(52) U.S. Cl. ...................... 324/207.21; 324/252; 360/314
(58) Field of Search ..................................... 324/173, 174, 324/207.12, 207.21, 207.25, 252; 360/113, 314, 316; 338/32 R

(56) References Cited

U.S. PATENT DOCUMENTS

| | | | |
|---|---|---|---|
| 4,616,281 | * 10/1986 | Nakamura | 324/252 X |
| 5,159,513 | 10/1992 | Dieny et al. | 360/113 |
| 5,206,590 | 4/1993 | Dieny et al. | 324/252 |
| 5,287,238 | * 2/1994 | Baumgart et al. | 324/207.21 X |
| 5,422,571 | * 6/1995 | Gurney et al. | 324/252 |
| 5,551,586 | 9/1996 | Uenoyama et al. | . |
| 5,561,368 | * 10/1996 | Doveck et al. | 324/252 |
| 5,650,721 | * 7/1997 | van den Berg et al. | 324/207.21 |
| 5,744,950 | * 4/1998 | Seefeldt | 324/174 X |
| 5,828,525 | * 10/1998 | Iwasaki et al. | 360/113 |
| 5,945,825 | * 8/1999 | Clemens | 324/252 |

FOREIGN PATENT DOCUMENTS

| | | |
|---|---|---|
| 44 27 495 | 2/1996 | (DE) . |
| 44 34 912 | 4/1996 | (DE) . |
| 8-0701145 | 3/1996 | (JP) . |

* cited by examiner

Primary Examiner—Gerard Strecker
(74) Attorney, Agent, or Firm—Brinks Hofer Gilson & Lione

(57) ABSTRACT

A magnetoresistive sensor includes a plurality of multilayered magnetoresistive films arranged in parallel. Each multilayered magnetoresistive film includes at least one pinned ferromagnetic layer and at least one free magnetic layer. Reversion of magnetization of the pinned ferromagnetic layer is pinned, whereas the vector of magnetization of the free ferromagnetic layer freely reverses in response to an external magnetic field. The vectors of magnetization of the pinned ferromagnetic layers in two adjacent multilayered magnetoresistive films are substantially antiparallel to each other.

12 Claims, 5 Drawing Sheets

ROTATION ANGLE (°)

MAGNETIC SENSOR EXHIBITING LARGE CHANGE IN RESISTANCE AT LOW EXTERNAL MAGNETIC FIELD

BACKGROUND OF THE INVENTION

1. Field of the Invention

The present invention relates to magnetoresistive sensors used as proprioceptors or position sensors, angle sensors and so on.

2. Description of the Related Art

Known magnetoresistive (MR) elements include anisotropic magnetoresistive (AMR) elements based on anisotropic magnetoresistive phenomena and giant magnetoresistive (GMR) elements based on spin-dependent scattering phenomena of conduction electrons. U.S. Pat. No. 5,159,513 discloses a spin-valve element having high magnetic resistance effects at a low external magnetic field, as an example of the GMR elements.

Since noncontact potentiometers and magnetic sensors using MR elements, such as noncontact angle sensors and position sensors, operate by direct current flows or low frequency current flows, use of high pass filters is not allowed when the DC offset component (the component of the resistance not changing by the magnetic field) is removed from the output voltages of the MR elements. Herein, the output voltage of the MR element is represented by the following equation:

$$V = (R_0 + \Delta R)i$$

wherein $R_0$ is the invariable component not changing by the magnetic field, $\Delta R$ is the variable component changing by the magnetic field, i is a current flow in the element, and thus the DC offset component is represented by $R_0 i$. Removal of the DC offset component is essential for the signal processing, such as amplification, in the succeeding circuits.

As shown in FIG. 6, in a typical conventional circuit configuration, an MR element 1 and another MR element 2, which have opposite signals to each other of a change in resistance to a magnetic field, are connected in series, two terminals A and C are provided at both unconnected ends of the MR elements 1 and 2, and an intermediate terminal B is provided between the MR elements 1 and 2 so as to collect the differential output between the two MR elements 1 and 2. The output $V_1 = (R_0 + \Delta R)i$ of the MR element 1 is measured between the terminals A and B, and the output $V_2 = (R_0 \Delta R)i$ of the MR element 2 is measured between the terminals B and C, and thus differential output $2\Delta Ri$ as the variable component is given by $2\Delta Ri = V_1 - V_2$.

Another conventional configuration is shown in FIG. 7. A bridge circuit includes four MR elements 3, 4, 5 and 6, wherein the MR elements 3 and 5 have the same signal of a change in resistance, the MR elements 4 and 6 also have the same signal of a change in resistance, and the signal of the MR elements 3 and 5 and the signal of the MR elements 4 and 6 are opposite to each other. Terminal a, b, c and d are provided between the MR elements 3 and 6, between the MR elements 4 and 5, between the MR elements 3 and 4, and between the MR elements 5 and 6, respectively. A variable component can be detected from the differential output voltages between these terminals by canceling the invariable component.

FIG. 8 shows a concrete example of the conventional circuit configuration shown in FIG. 6. In FIG. 8, two rectangular patterns 7 and 8 formed of magnetic films composed of a Ni—Fe alloy (permalloy) are arranged perpendicular to each other, terminals D and E are provided at the ends of pattern 7 and pattern 8, respectively, and an intermediate terminal F is provided at the connection point of the patterns 7 and 8. Since the resistance of each of the AMR elements 7 and 8 depends on the angle θ between the current i and the magnetization M in the direction of the arrow M, the patterns 7 and 8 are arranged perpendicular to each other. The changes in resistances of the AMR elements 7 and 8 to the magnetization M are respectively represented by the equations:

$$R_1 = R_0 - \Delta R \cdot \sin^2(90 - \theta), \text{ and}$$

$$R_2 = R_0 - \Delta R \cdot \sin^2 \theta,$$

The variable component therefore is determined by the following equation (I):

$$R = R_1 - R_2 = \Delta R[\sin^2 \theta - \sin^2(90-\theta)] = -\Delta R \cdot \cos 2\theta \qquad (I)$$

wherein $R_1$ is the resistance of the AMR element 7, $R_2$ is the resistance of the AMR element 8, and $R_0$ is the invariable component of the resistance of each of the AMR elements 7 and 8.

In a sensor having the circuit configuration shown in FIG. 8, when the magnetization directions of the AMR elements 7 and 8 are simultaneously rotated by rotating a magnet provided near the AMR elements 7 and 8 (such a rotation corresponds to the operation of a noncontact potentiometer), the AMR element 7 rotates, for example, in the direction causing increasing θ, whereas the AMR element 8 rotates in the direction causing decreasing θ. The output phases of the AMR elements 7 and 8 are therefore antiparallel to each other.

It may be expected that if spin-valve elements showing high magnetoresistive effects at a low external magnetic field among GMR elements are used instead of the AMR elements 7 and 8, a high output can be obtained because of a larger variable component of the magnetic resistance, and thus a sensor with a high sensitivity can be fabricated; however, since the variable component in the spin-valve elements does not depend on the angle θ between the magnetization M and current, the spin-valve elements cannot be used in the circuit configuration as shown in FIG. 8.

The above-mentioned U.S. Pat. No. 5,159,513 discloses a magnetoresistive sensor as an example of magnetic sensors using spin-valve elements. As shown in FIG. 9, this magnetoresistive sensor 10 has a layered structure composed of a free ferromagnetic layer 12, a nonmagnetic layer 13, a pinned ferromagnetic layer 14, and an antiferromagnetic layer 15 which are deposited on a nonmagnetic substrate 11. The vector 16 of magnetization of the pinned ferromagnetic layer 14 is fixed by magnetic exchange coupling with the antiferromagnetic layer 15, and the vector 17 of magnetization of the free ferromagnetic layer 12 is perpendicular to the vector 16 of magnetization of the pinned ferromagnetic layer 14. The vector 17 of magnetization of the free ferromagnetic layer 12 is, however, not fixed, and thus rotates by an external magnetic field.

When a magnetic field h is applied to such a configuration, the vector 17 of magnetization of the free ferromagnetic layer 12 rotates as shown in dotted arrows in FIG. 9 in response to the vector of the magnetic field h. The angle between the vectors of. magnetization of the free ferromagnetic layer 12 and pinned ferromagnetic layer 14 therefore changes, and thus the variable component of the magnetic resistance changes. The magnetic field can therefore be detected by the change in the resistance. The resistance depends on the angle φ between the vectors of magnetization of the pinned ferromagnetic layer 14 and free ferromagnetic layer 12; that is, the resistance has a minimum at φ=0°, and has a maximum at φ=180°.

The present inventor has conceived that when a pair of magnetic sensors are provided on a substrate so that the pinned ferromagnetic layers 14 have the opposite (antiparallel) vectors of magnetization from each other, these magnetic sensors will output reversed-phase signals from each other even when the vectors of magnetization of the free and pinned ferromagnetic layers rotate in the same direction, and thus a noncontact potentiometer, such as an angle sensor or position sensor, can be produced by using spin-valve elements.

In known spin-valve elements, however, the vectors of magnetization of the pinned ferromagnetic layers 14 are fixed by a unidirectional anisotropy by means of the antiferromagnetic layers 15, hence the vectors of magnetization of the pinned ferromagnetic layers 14 must be determined by depositing or annealing of the layers in a magnetic field. As a result, it is substantially impossible to provide pinned ferromagnetic layers having different vectors of magnetization in the two magnetic sensors on the substrate.

In prior art technologies for magnetic sensor fabrication, therefore, two spin-valve elements having reversed phases from each other have been formed on different wafers, and these two reverse-phase spin-valve elements have been arranged next to each other. Such a fabrication process causes high material and production costs. Further, these two spin-valve elements will have slightly different resistances because of the use of different wafers. Such different resistances prohibit the use of the spin-valve elements in the bridge configuration shown in FIG. 7.

A proposed configuration involves shielding with a magnetic film of an MR element 2 or 1 in the circuit shown in FIG. 6 or MR elements 3 and 5 (or 4 and 6) in the circuit shown in FIG. 7 from the external magnetic field, hence these elements functions as mere resistances. Although such a configuration can remove DC offset components, the output will decrease to half.

In a feasible production process of the spin-valve elements, a conductive pattern for generating a magnetic field during annealing is formed, and the vectors of the pinned ferromagnetic layers are controlled by annealing the spin-valve elements by conducting an electrical current in the conductive pattern. This process, however, requires a photolithographic step for forming the conductive pattern, and thus causes high production costs.

SUMMARY OF THE INVENTION

It is an object of the present invention to provide a high-sensitivity magnetoresistive sensor composed of a multilayered magnetoresistive element having a highly variable component of the resistance with a low external magnetic field.

It is another object of the present invention to provide a magnetoresistive sensor which can be formed of spin-valve elements in which the variable component of the resistance does not depend on the angle of magnetization.

A magnetoresistive sensor, in accordance with the present invention for solving the above-mentioned problems, includes a plurality of multilayered magnetoresistive films arranged in parallel each comprising at least one pinned ferromagnetic layer and at least one free magnetic layer, reversion of magnetization of the pinned ferromagnetic layer being pinned, the vector of magnetization of the free ferromagnetic layer freely reversing in response to an external magnetic field, wherein the vectors of magnetization of the pinned ferromagnetic layers in two adjacent multilayered magnetoresistive films are substantially antiparallel to each other.

The present invention is characterized in that the two multilayered magnetoresistive films are arranged in parallel, and a hard magnetic layer is provided under one of the multilayered magnetoresistive films.

The present invention is characterized in that the coercive force of the pinned ferromagnetic layer of the multilayered magnetoresistive film provided with the hard magnetic layer is higher than the coercive force of the pinned ferromagnetic layer of the other multilayered magnetoresistive film.

The present invention is characterized in that the pinned ferromagnetic layer comprises a ferromagnetic material having hard magnetic characteristics. The pinned ferromagnetic layer may come into contact with a coercive-force-enhancing layer comprising $\alpha\text{-}Fe_2O_3$.

Another aspect of the present invention is a magnetoresistive sensor comprising a plurality of multilayered magnetoresistive films formed on a substrate, each multilayered magnetoresistive film comprising at least one pinned ferromagnetic layer and at least one free magnetic layer, reversion of magnetization of the pinned ferromagnetic layer being pinned, the vector of magnetization of the free ferromagnetic layer freely reversing in response to an external magnetic field, a hard magnetic layer being provided under one of two adjacent multilayered magnetoresistive films, wherein after all the multilayered magnetoresistive films are magnetized by applying a magnetic field which is larger than the coercive force of the hard magnetic layer to the entire substrate, the entire substrate is magnetized by a magnetic field which is larger than the coercive force of the pinned ferromagnetic layer in the multilayered magnetoresistive film not having the hard magnetic layer, so that the vector of magnetization of the pinned ferromagnetic layer of the multilayered magnetoresistive film having the hard magnetic layer and the vector of magnetization of the pinned ferromagnetic layer of the multilayered magnetoresistive film not having the hard magnetic layer are substantially antiparallel to each other.

A further aspect of the present invention is a magnetoresistive sensor comprising a plurality of multilayered magnetoresistive films formed on a substrate, each multilayered magnetoresistive film comprising at least one pinned ferromagnetic layer and at least one free magnetic layer, reversion of magnetization of the pinned ferromagnetic layer being pinned, the vector of magnetization of the free ferromagnetic layer freely reversing in response to an external magnetic field, wherein the pinned ferromagnetic layer of each multilayered magnetoresistive film is individually magnetized with a magnetic head, such that the vector of magnetization of the pinned ferromagnetic layer in one multilayered magnetoresistive film among two adjacent multilayered magnetoresistive films is exactly antiparallel to the vector of magnetization of the pinned ferromagnetic layer in the other multilayered magnetoresistive film.

The aspect is characterized in that the pinned ferromagnetic layer in at least one multilayered magnetoresistive film among the plurality of multilayered magnetoresistive films comprises a ferromagnetic material having hard magnetic characteristics.

A further aspect of the present invention is a magnetoresistive sensor comprising a rotatable axis provided with a magnet and a plurality of multilayered magnetoresistive films arranged in parallel near the magnet.

DESCRIPTION OF THE PREFERRED EMBODIMENTS

The preferred embodiments of the present invention will now be described with reference to the drawings.

Figure 1A:
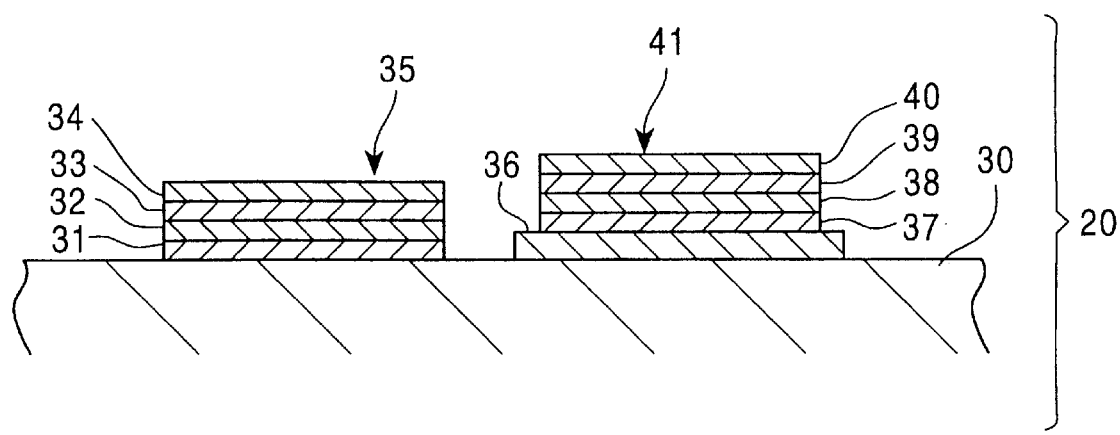
FIGS. 1A and 1B are a sectional view and a plan view, respectively, of a first embodiment of a GMR sensor in accordance with the present invention.
Figure 1B:
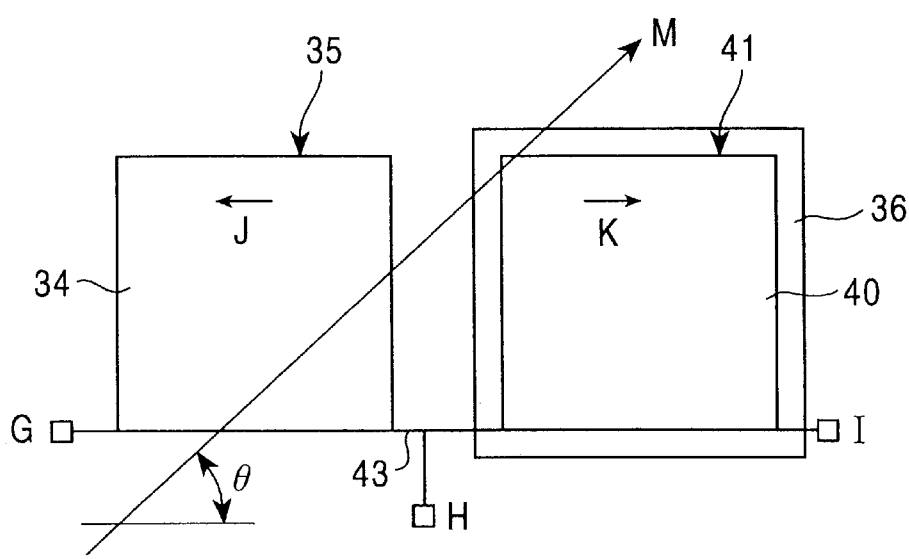

FIG. 1 shows an embodiment of a GMR sensor 20 in accordance with the present invention. The GMR sensor 20 is provided with a magnetoresistive element 35, which is formed by depositing a rectangular pinning layer 31 composed of an antiferromagnetic or hard magnetic material, a pinned ferromagnetic layer 32, a nonmagnetic layer 33 and a free ferromagnetic layer 34 on a single-crystal or polycrystalline substrate 30 in that order. The GMR sensor 20 is also provided with a multilayered magnetoresistive element 41 beside the magnetoresistive element 35. The multilayered magnetoresistive element 41 is formed by depositing a rectangular hard magnetic layer 36, a rectangular pinning layer 37 composed of an antiferromagnetic or hard magnetic material, a pinned ferromagnetic layer 38, a nonmagnetic layer 39, and a free ferromagnetic layer 40 on the substrate 30 in that order. When the pinning layers 37 and 31, the pinned ferromagnetic layers 38 and 32, the nonmagnetic layers 39 and 33, or the free ferromagnetic layers 40 and 34 are formed of the same material, these layers can be deposited by the same deposition process. As shown in FIG. 1B, the substrate 30 is provided with a conductor 43 formed thereon for connecting in series the magnetoresistive elements 35 and 41 (the conductor 43 is omitted in FIG. 1A). A terminal G is provided at one end of the conductor 43, and terminal I is provided at the other end of the conductor 43. Further, the conductor 43 is provided with a terminal H between the free ferromagnetic layers 34 and 40.

The pinned ferromagnetic layer 32 of the magnetoresistive element 35 has, for example, a vector of magnetization toward the left as shown by the arrow J in FIG. 1B, whereas the pinned ferromagnetic layer 38 of the magnetoresistive element 41 has a vector of magnetization toward the opposite direction, that is, to the right as shown by the arrow K. The vectors of magnetization of these two pinned ferromagnetic layers are not always required to be in exactly opposite directions, and several degrees of shift from the exactly opposite directions may be allowable in the present invention.

Preferred materials for the substrate 30 include silicone with a diamond-type structure, magnesium oxide with a rock-salt-type structure, $MgAl_2O_4$ with a spinel-type structure, gadrium garnet with a garnet-type structure, and hexagonal sapphire ($\alpha$-$Al_2O_3$) and $\alpha$-$Fe_2O_3$ which have a corundum structure. A glass substrate may be used instead of these substrates.

The pinning layer 31 is provided for generating magnetic exchange coupling with the pinned ferromagnetic layer 32 and thus enhancing the coercive force of the pinned ferromagnetic layer 32. The pinning layer 31 is formed of $\alpha$-$Fe_2O_3$ as an antiferromagnetic material (coercive force enhancing layer), or a hard magnetic material, such as a Co—Pt alloy, Co—Cr—Pt alloy, Co—Cr—Ta alloy, or Co.

Examples of materials forming the ferromagnetic layers 32, 34, 38 and 40 include Ni—Fe alloys, Co—Fe alloys, Ni—Co alloys, metallic Co, and Ni—FE—Co alloys. Ferromagnetic layers 32 and 38 may be composed of Co and ferromagnetic layers 34 and 40 may be composed of Ni—Fe alloys. Alternatively, the ferromagnetic layers may have a double-layered structure composed of a Co layer and a Ni—Fe alloy layer. When such a double-layered structure is employed, thin Co layers may be provided on the sides of the nonmagnetic layers 33 and 39.

In the configuration for forming giant magnetoresistive effects in which the nonmagnetic layer 33 (or 39) is formed between the ferromagnetic layers 32 and 34 (or 38 and 40), a higher magnetoresistive effect is achieved by the ferromagnetic layers 32 and 34 (or 38 and 40) being composed of the same material rather than different materials, because factors other than spin-dependent scattering of conduction electrons will not occur. That is, a higher spin-dependent scattering effect and thus a larger MR effect are achieved by an interface between Co and Cu rather than between Ni—Fe and Cu. Accordingly, it is preferable that when the ferromagnetic layer 32 (or 38) is composed of Co, the ferromagnetic layer 34 (or 40) be replaced with a Co layer having a given thickness at the side of the nonmagnetic layer 33 (or 39). Instead of the Co layer, the ferromagnetic layer 34 (or 40) may be a gradient layer containing an increasing amount of Co toward the side of the nonmagnetic layer 33 (or 39).

The nonmagnetic layers 33 and 39 are composed of a conductive nonmagnetic material, such as Cu, Cr, Au or Ag, and have a thickness of 20 to 40 Å. When the thickness of the nonmagnetic layers 33 and 39 is smaller than 20 Å, undesirable magnetic coupling will easily occur between the ferromagnetic layer 32 (or 38) and the ferromagnetic layer 34 (or 40). On the other hand, when the thickness of the nonmagnetic layers 33 and 39 is larger than 40 Å, the efficiency of the conduction electrons scattered at the interface between the nonmagnetic layer 33 (or 39) and the ferromagnetic layers 32 and 34 (or 38 and 40) will decrease and will also decrease by shunt effects of electrical currents, resulting in an undesirable decrease in the magnetoresistive effect.

The hard magnetic layer 36 is preferably formed of a hard magnetic material, such as a Co—Pt alloy, a Co—Cr—Pt alloy, or a Co—Cr—Ta alloy. Among these materials, a $Co_{92}Pt_8$ alloy with a thickness of 5 nm has a coercive force of 470 Oe, a $Co_{78}Pt_{22}$ alloy with a thickness of 40 nm has a coercive force of 1200 Oe, a $Co_{75}Cr_{18}Pt_7$ alloy with a thickness of 20 nm has a coercive force of 900 Oe, and a $Co_{86}Cr_{12}Ta_2$ alloy with a thickness of 10 nm has a coercive force of 840 Oe.

When the coercive force of the ferromagnetic layer 32 of the magnetoresistive element 35 is $H_{c1}$, that of the pinned ferromagnetic layer 38 of the magnetoresistive element 41 is $H_{c2}$, and that of the hard magnetic layer 36 is $H_{c3}$, the relationship $H_{c1}<H_{c2}<H_{c3}$ must be satisfied. Further, it is preferable that $H_{c1}\leq 100$ Oe and $H_{c3}-H_{c1}\leq 50$ Oe.

In the configuration shown in FIG. 1, a protective layer may be provided for covering the multilayered magnetoresistive elements 35 and 41. The multilayered magnetoresistive elements 35 and 41 may be provided on a protective layer or a leveling layer which is formed on the substrate 30.

In another multilayered configuration of the magnetoresistive element, another nonmagnetic layer, another pinned ferromagnetic layer and another pinning layer may be formed on the above-mentioned multilayered configuration composed of the pinning layer, pinned ferromagnetic layer, nonmagnetic layer and free ferromagnetic layer.

A steady-state current is conducted to the magnetoresistive elements 35 and 41 in the configuration shown in FIG. 1. The coercive forces of the pinned ferromagnetic layers 32 and 38 increase by magnetic exchange coupling with the pinning layers 31 and 37, and thus the vectors of magnetization of the pinned ferromagnetic layers 32 and 38 are pinned whereas the vectors of magnetization of free ferromagnetic layers 34 and 40 rotate without restriction. As a result, a difference in coercive forces occurs between the ferromagnetic layers 32 and 34 (or 38 and 40), and thus a giant magnetoresistive effect occurs. That is, when an external magnetization acts on the free ferromagnetic layers 34 and 40 in the direction of the arrow M in FIG. 1B, the vectors of magnetization of the ferromagnetic layers 34 and 40 easily rotate, and the resistances of the ferromagnetic layers 34 and 40 change with the rotation. Further, the vectors of the pinned ferromagnetic layers 32 and 38 are antiparallel to each other, hence the vectors of magnetization of the free ferromagnetic layers 34 and 40 rotate. As a result, the resistance of the free ferromagnetic layers 34 and 40 change in response to the rotation of the magnetization.

When an external magnetization H with an angle $\theta$ acts as shown in FIG. 1B, the above-mentioned equation (I) stands:

$$R = R_1 - R_2 = \Delta R[\sin^2\theta - \sin^2(90-\theta)] = -\Delta R \cdot \cos 2\theta \qquad (I)$$

As a result, a change of the resistance is obtained in response to the angle $\theta$. The angle of the magnetization H can be detected from such a change of the resistance. Since the multilayered configuration of the giant magnetoresistive sensor shown in FIG. 1 has a remarkably higher variable component than that of conventional AMR elements, a larger change in the resistance is obtained, resulting in high sensitivity detection of the angle of the magnetization H.

A typical conventional configuration composed of an Fe—Ni AMR material has a magnetoresistive effect of approximately 3%, whereas the multilayered configuration in accordance with the present invention composed of the nonmagnetic layer arranged between the Ni—Fe alloy ferromagnetic layers and $\alpha Fe_2O_3$ pinning layers 31 and 37 has a magnetoresistive effect of approximately 6%. When using the Co alloy ferromagnetic layers instead of the Ni—Fe alloy ferromagnetic layers, the magnetoresistive effect increases to approximately 12%. Accordingly, the multilayered configuration in accordance with the present invention has a considerably high change in the resistance compared to conventional configurations, and a high sensitivity sensor can be achieved.

When the pinning layers 31 and 37 are composed of antiferromagnetic $\alpha$-$Fe_2O_3$ which has a higher corrosion resistance than that of FeMn as a conventional pinning antiferromagnetic material, a high Neel temperature (677° C.), and a high blocking temperature (320° C.), the magnetoresistive sensor is resistive to a change in temperature. In contrast, the FeMn alloy has a blocking temperature of approximately 150° C., and a NiO alloy has a blocking temperature of approximately 250° C. These alloys are clearly inferior to $\alpha$-$Fe_2O_3$ in thermal resistance. The use of $\alpha$-$Fe_2O_3$ as the magnetoresistive element material causes a large change in the resistance, and a reduced hysteresis loss.

The GMR sensor 20 shown in FIG. 1 can be produced by depositing the above-mentioned layers by any deposition processes such as a sputtering process on the substrate 30 and removing the unnecessary portion of each layer by a photolithographic patterning process. Next, a magnetic field larger than the coercive force of the hard magnetic layer 36 is applied to the entire substrate to magnetize all the elements such that the vectors of magnetization lie along the arrow K in FIG. 1B. After the magnetization of all the elements, a magnetic field, which is smaller than the coercive force of the hard magnetic layer 36 and higher than the coercive force of the pinned ferromagnetic layer of the magnetoresistive element 35, is applied to the entire substrate to magnetize the magnetoresistive element 35 such that the vector of the magnetization lies along the arrow J in FIG. 1B. The vector of magnetization of the magnetoresistive element 41 in the direction of the arrow K is maintained during such a magnetization process, because the applied magnetic field is smaller than the coercive force of the hard magnetic layer 36. As a result, the vectors of the pinned ferromagnetic layers 32 and 38 in the magnetoresistive elements 35 and 41 can be exactly antiparallel to each other.

Figure 2:
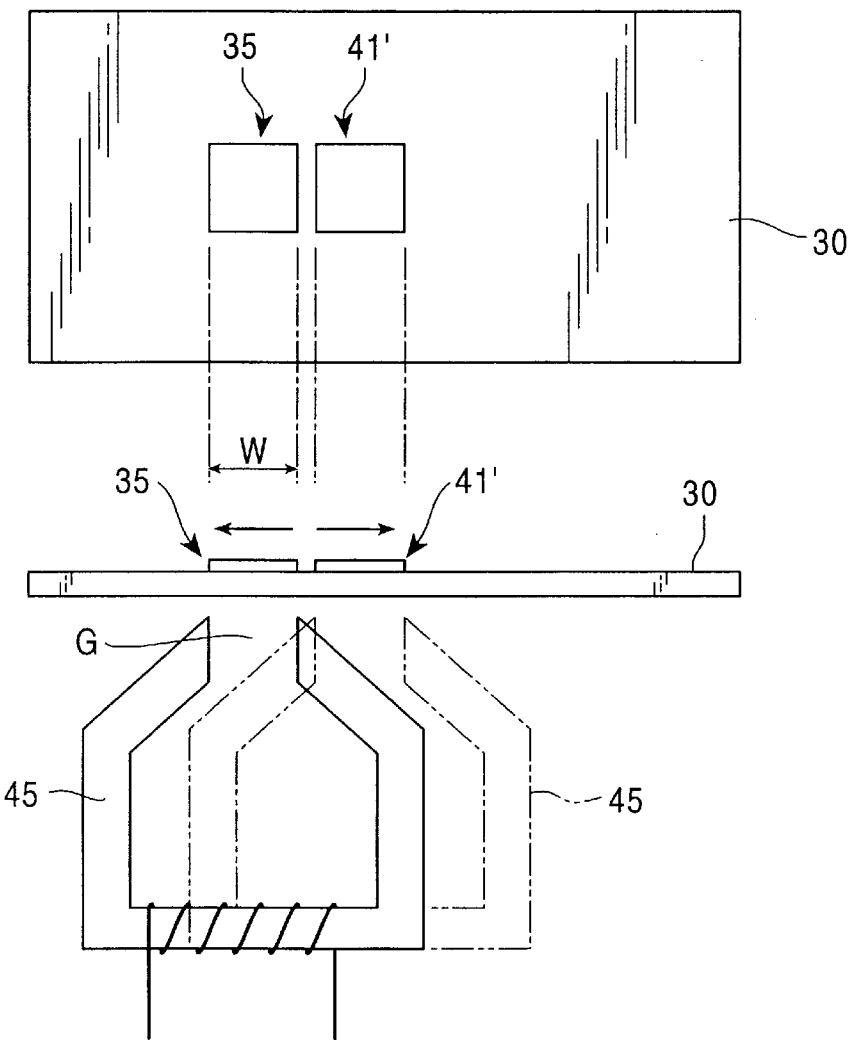
FIG. 2 is a schematic view illustrating magnetization of a GMR element in the production process of the GMR sensor shown in FIG. 1.
Figure 3:
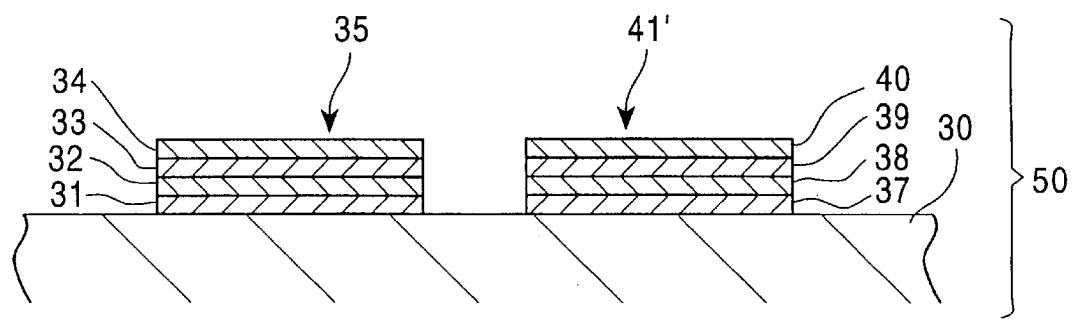
FIG. 3 is a cross-sectional view of a second embodiment of the GMR sensor in accordance with the present invention.

FIG. 3 shows another embodiment of the GMR sensor in accordance with the present invention. The GMR sensor 50 lacks the hard magnetic layer 36 in the above-mentioned GMR sensor 20. In order to exactly reverse the vectors of magnetization of the pinned ferromagnetic layers 31 and 37 in such a configuration, as shown in FIG. 2, the pinned ferromagnetic layer 37 is formed of a hard magnetic material or $\alpha$-$Fe_2O_3$, and a magnetic field is applied from the rear face of the substrate 30 using a magnetic head 45 having a gap G, which is the same as the width W of the magnetoresistive element 35, so that the pinned ferromagnetic layer 32 of the magnetoresistive element 35 is magnetized in the direction of the arrow J in FIG. 1B. Next, the pinned ferromagnetic layer 38 of the magnetoresistive element 41' is magnetized in the direction of the arrow K using the same magnetic head 45. Other structures of the GMR sensor 50 are the same as those of the GMR sensor 20.

Figure 4:
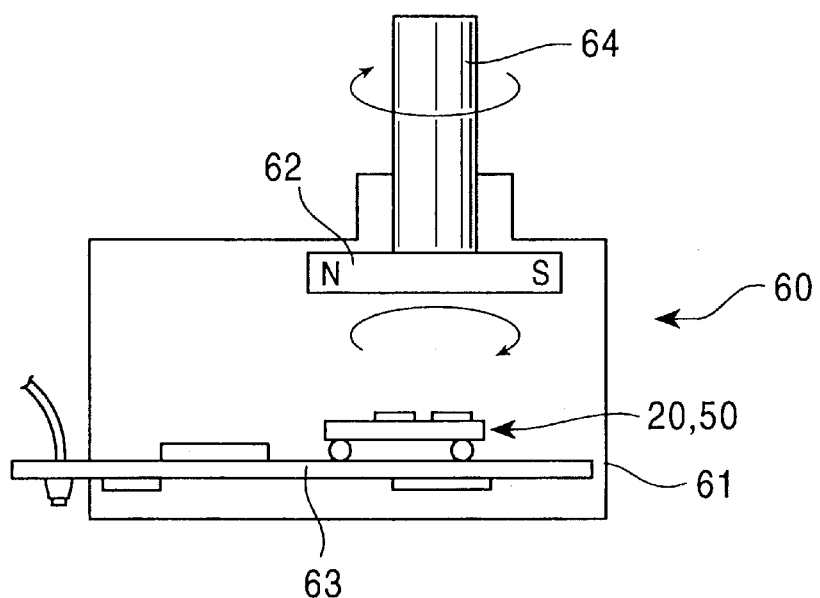
FIG. 4 is a schematic view of an angle sensor provided with the GMR sensor in accordance with the present invention.
Figure 5:
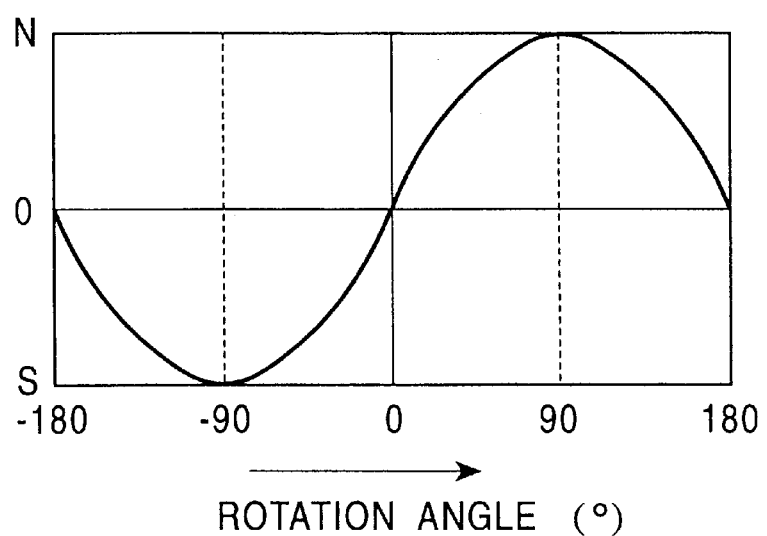
FIG. 5 is a graph of output characteristics of the angle sensor shown in FIG. 4.
Figure 6:
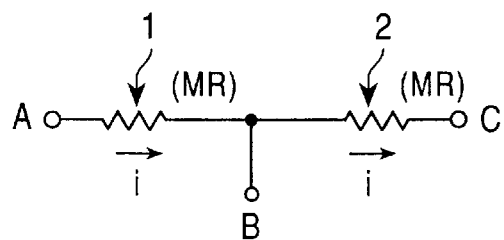
FIG. 6 is a circuit diagram of a first example of a sensor using conventional AMR elements.
Figure 7:
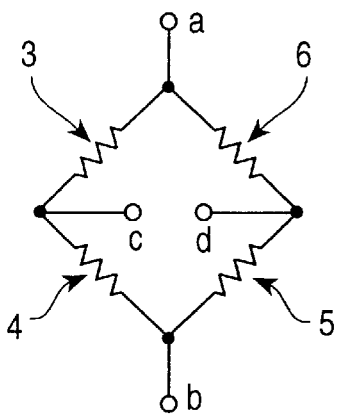
FIG. 7 is a circuit diagram of a second example of a sensor using conventional AMR elements.
Figure 8:
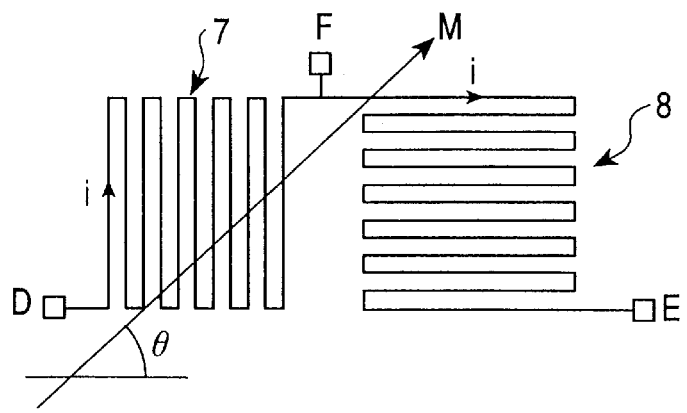
FIG. 8 is a plan view of an example of an angle sensor provided with the circuit shown in FIG. 6.
Figure 9:
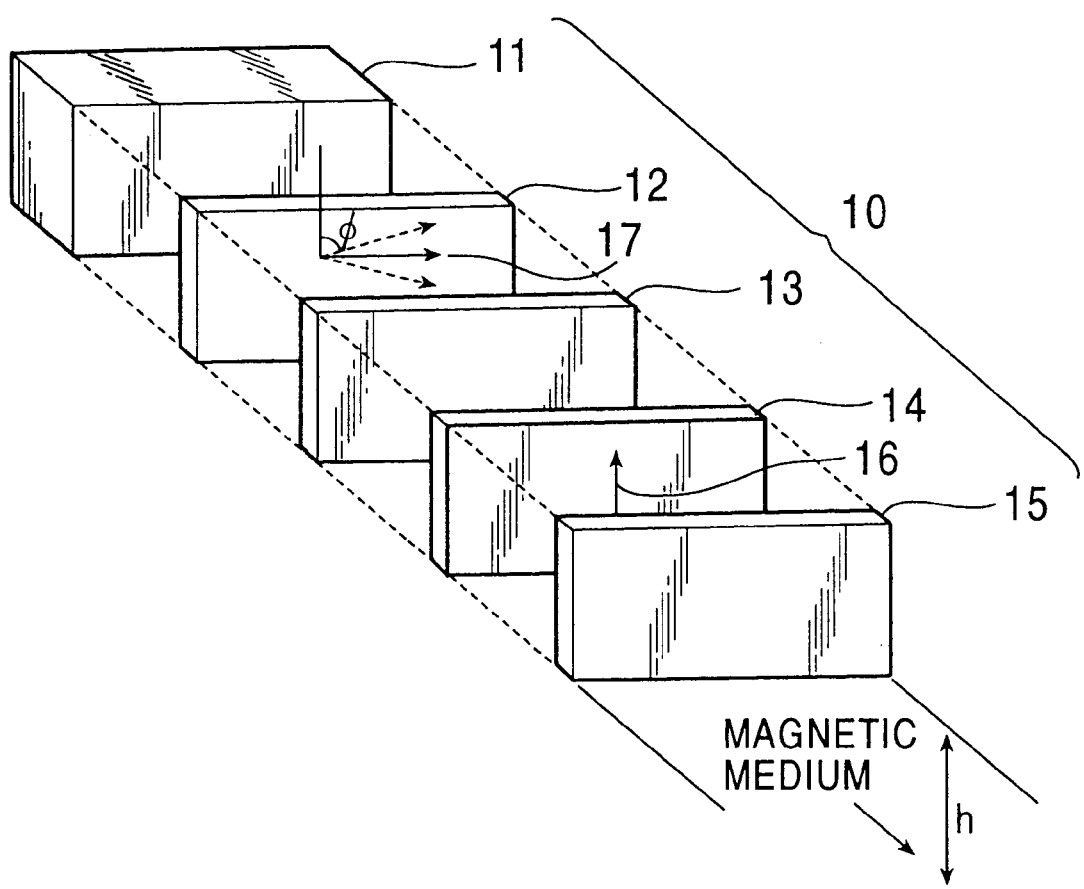
FIG. 9 is an isometric assembly view of a conventional spin-valve configuration.

FIG. 4 shows an angle sensor provided with the GMR sensor 20 or 50 shown in FIG. 1 or 3. The angle sensor 60 is provided with a case 61. A rotatable shaft 61 is vertically provided so as to pass through the upper wall of the case 61, and a disk magnet 62 is fixed to the lower end of the shaft 64. A board 63 is provided at the lower portion in the case 61, and the GMR sensor 20 or 50 is fixed on the board 63 below the magnet 62. The vector of magnetization applied to the GMR sensor 20 or 50 from the magnet 62 changes with the rotation of the shaft 64, resulting in a change in the resistance. As a result, the angle of the rotation of the shaft 64 can be detected from the change in the resistance. FIG. 5 is a graph illustrating the change in the vector of magnetization with the angle of the rotation of the shaft in the angle sensor 60. The change in the vector of the magnetization has a sinusoidal curve as shown in FIG. 5.

As described above, in the present invention, a plurality of multilayered magnetoresistive films are arranged in parallel and the vectors of magnetization of the pinned ferromagnetic layers of these multilayered magnetoresistive films are substantially antiparallel to each other. When the external magnetic field rotates, the resistances of the multilayered magnetoresistive films having opposite directions of magnetization change in opposite phases. Thus, a change in the direction of the external magnetic field can be detected as the difference between these resistances. Since each multilayered magnetoresistive film includes a combination of a pinned ferromagnetic layer and a free ferromagnetic layer having a giant magnetoresistive effect, the magnetoresistive sensor of the present invention exhibits a large change in resistance with respect to a change in the vector of the external magnetic field and thus has a high sensitivity to the change in the vector of the external magnetic field.

When two multilayered magnetoresistive films are arranged and when a hard magnetic layer is arranged below one of the two multilayered magnetoresistive films, the vector of magnetization of the hard magnetic layer can control the vector of magnetization of the pinned ferromagnetic layer. As a result, the vectors of magnetization of the two multilayered magnetic films can be easily oriented to be antiparallel to each other.

When the pinned ferromagnetic layer is composed of a hard magnetic material, the vector of the pinned ferromagnetic layer can be controlled in an appropriate direction by magnetization. Thus, the direction of magnetization of the pinned ferromagnetic layers of the multilayered magnetoresistive films, which are arranged in parallel, can be easily oriented to be antiparallel.

When the coercive-force-enhancing layer or pinning layer of the pinned ferromagnetic layer is composed of a-$Fe_2O_3$, the magnetoresistive sensor can obtain a large change in resistance, and a reduced hysteresis. Thus, this sensor has h sensitivity.

When a plurality of multilayered magnetoresistive films, each including a pinned ferromagnetic layer and a free magnetic layer, are provided on a substrate, when a hard magnetic layer having a coercive force which is higher than the coercive force of a pinned ferromagnetic layer is provided below one of the multilayered magnetoresistivep films, and when each of the multilayered magnetoresistive films is magnetized while gradually varying the intensity and the direction of magnetization, the vectors of the APR pinned ferromagnetic layers can be oriented antiparallel to each other.

When the pinned ferromagnetic layer is composed of a hard magnetic material is in contact with a coercive-force-enhancing layer composed of a-$Fe_2O_3$, the vectors of the individual pinned ferromagnetic layers can be controlled without restriction by independently magnetizing these pinned ferromagnetic layers. Thus, the vectors of magnetization of the pinned ferromagnetic layers can be oriented antiparallel to each other.

What is claimed is:

1. A magnetoresistive sensor comprising:
   two multilayered magnetoresistive films arranged in parallel and adjacent to each other on a substrate, each multilayered magnetoresistive film containing a pinned ferromagnetic layer and a free magnetic layer, reversion of magnetization of said pinned ferromagnetic layer being pinned, and a vector of magnetization of said free ferromagnetic layer freely reversing in response to an external magnetic field;
   a hard magnetic layer provided under one of said multilayered magnetoresistive films; and
   a conductor connecting the multilayered magnetoresistive films in series and provided with terminals disposed at ends thereof;
   wherein
      the vectors of magnetization of the pinned ferromagnetic layers in the two adjacent multilayered magnetoresistive films are substantially antiparallel to each other along an axis of current flow of the conductor; and
      a coercive force of the pinned ferromagnetic layer of the multilayered magnetoresistive film provided with said hard magnetic layer is higher than a coercive force of the pinned ferromagnetic layer of the adjacent multilayered magnetoresistive film.

2. A magnetoresistive sensor according to claim 1, wherein said pinned ferromagnetic layer comprises a ferromagnetic material having hard magnetic characteristics.

3. A magnetoresistive sensor according to claim 1, wherein said pinned ferromagnetic layer comes into contact with a coercive-force-enhancing layer comprising α-$Fe_2O_3$.

4. A magnetoresistive sensor comprising:
   a plurality of multilayered magnetoresistive films formed on a substrate, each multilayered magnetoresistive film containing a pinned ferromagnetic layer and a free magnetic layer, reversion of magnetization of said pinned ferromagnetic layer being pinned, and a vector of magnetization of said free ferromagnetic layer freely reversing in response to an external magnetic field; and
   a hard magnetic layer provided under one of two adjacent multilayered magnetoresistive films;
   wherein after all the multilayered magnetoresistive films are magnetized by applying a magnetic field which is larger than the coercive force of the hard magnetic layer to the entire substrate, the entire substrate is magnetized by a magnetic field, which is larger than a coercive force of the pinned ferromagnetic layer in the multilayered magnetoresistive film not having the hard magnetic layer, such that a vector of magnetization of the pinned ferromagnetic layer of the multilayered magnetoresistive film having the hard magnetic layer and a vector of magnetization of the pinned ferromagnetic layer of the multilayered magnetoresistive film not having the hard magnetic layer are substantially antiparallel to each other along an axis of current flow of a conductor; and
   the conductor connects the multilayered magnetoresistive film having the hard bias layer and the multilayered magnetoresistive film not having the hard bias layer in series and is provided with terminals disposed at ends thereof.

5. A magnetoresistive sensor according to claim 4, wherein among said plurality of multilayered magnetoresistive films, the pinned ferromagnetic layer of at least one multilayered magnetoresistive film comprises a ferromagnetic material having hard magnetic characteristics.

6. A magnetoresistive sensor comprising:
   a plurality of multilayered magnetoresistive films formed on a substrate, each multilayered magnetoresistive film containing a pinned ferromagnetic layer and a free magnetic layer, reversion of magnetization of said pinned ferromagnetic layer being pinned, and a vector of magnetization of said free ferromagnetic layer freely reversing in response to an external magnetic field;
   wherein the pinned ferromagnetic layer of each multilayered magnetoresistive film is individually magnetized with a magnetic head, such that a vector of magnetization of the pinned ferromagnetic layer in one multilayered magnetoresistive film among two adjacent multilayered magnetoresistive films is substantially antiparallel along an axis of current flow of a conductor to a vector of magnetization of the pinned ferromagnetic layer in the adjacent multilayered magnetoresistive film; and the conductor connects the adjacent multilayered magnetoresistive films in series and is provided with terminals disposed at ends thereof.

7. A magnetoresistive sensor according to claim 6, wherein the pinned ferromagnetic layer in at least one multilayered magnetoresistive film among said plurality of multilayered magnetoresistive films comprises a ferromagnetic material having hard magnetic characteristics.

8. The magnetoresistive sensor of claim 1, further comprising a rotatable axis provided with a magnet, said multilayered magnetoresistive films arranged near said magnet.

9. A magnetoresistive sensor comprising:
   a plurality of multilayered magnetoresistive films arranged in parallel to each other on a substrate, each multilayered magnetoresistive film containing a pinned ferromagnetic layer and a free magnetic layer, reversion of magnetization of said pinned ferromagnetic layer being pinned, and a vector of magnetization of said free ferromagnetic layer freely reversing in response to an external magnetic field;
   a hard magnetic layer provided under only one of two adjacent multilayered magnetoresistive films; and
   a conductor connecting the adjacent multilayered magnetoresistive films in series and provided with terminals disposed at ends thereof;
   wherein
      the vectors of magnetization of the pinned ferromagnetic layers in the adjacent multilayered magnetoresistive films are substantially antiparallel to each other; and
      a coercive force of the pinned ferromagnetic layer of the multilayered magnetoresistive film provided with said hard magnetic layer is higher than a coercive force of the pinned ferromagnetic layer of the adjacent multilayered magnetoresistive film.

10. The magnetoresistive sensor according to claim 9, wherein at least one of said pinned ferromagnetic layers of said multilayered magnetoresistive films comprise a ferromagnetic material having hard magnetic characteristics.

11. The magnetoresistive sensor according to claim 9, wherein at least one of said pinned ferromagnetic layers of said multilayered magnetoresistive films contacts a coercive-force-enhancing layer comprising $\alpha\text{-Fe}_2\text{O}_3$.

12. The magnetoresistive sensor according to claim 9 further comprising a rotatable axis provided with a magnet, said multilayered magnetoresistive films arranged near said magnet.

* * * * *

UNITED STATES PATENT AND TRADEMARK OFFICE
CERTIFICATE OF CORRECTION

PATENT NO.    : 6,191,577 B1
DATED         : February 20, 2001
INVENTOR(S)   : Yoshito Sasaki et al.

Page 1 of 1

It is certified that error appears in the above-identified patent and that said Letters Patent is hereby corrected as shown below:

Title page,
FOREIGN PATENT DOCUMENTS,
Line 3, change "8-0701145" to -- EP 0701142 --.

Signed and Sealed this

Twelfth Day of March, 2002

Attest:

JAMES E. ROGAN
Attesting Officer    Director of the United States Patent and Trademark Office